(12) United States Patent
Ding et al.

(10) Patent No.: US 6,387,805 B2
(45) Date of Patent: *May 14, 2002

(54) COPPER ALLOY SEED LAYER FOR COPPER METALLIZATION

(75) Inventors: Peijun Ding, San Jose; Tony Chiang, Mountain View; Imran Hashim, Fremont; Bingxi Sun, Sunnyvale; Barry Chin, Saratoga, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,143

(22) Filed: Jun. 18, 1997

Related U.S. Application Data

(63) Continuation-in-part of application No. 08/853,191, filed on May 8, 1997, now Pat. No. 6,037,257.

(51) Int. Cl.[7] .............................................. H01L 21/44
(52) U.S. Cl. ....................... 438/687; 438/629; 438/660; 438/675; 438/678; 438/680
(58) Field of Search ................................ 438/687, 629, 438/660, 675, 678, 680

(56) References Cited

U.S. PATENT DOCUMENTS

| | | | |
|---|---|---|---|
| 5,391,517 A | * 2/1995 | Gelatos et al. | 438/687 |
| 5,654,232 A | * 8/1997 | Gardner | 438/687 |
| 5,744,394 A | * 4/1998 | Iguchi et al. | 438/687 |
| 5,747,360 A | 5/1998 | Nulman | 437/189 |
| 5,770,519 A | * 6/1998 | Klein et al. | 438/687 |

FOREIGN PATENT DOCUMENTS

| | | |
|---|---|---|
| EP | 508156 A | 10/1992 |
| EP | 725439 A | 8/1996 |

OTHER PUBLICATIONS

Murarka et al., "Copper metallization for ULSI and beyond," *Critical Reviews in Solid State and Materials Science*, vol. 10, No. 2, 1995, pp. 87–124.

Lanford et al., "Low–temperature passivation of copper by doping with Al or Mg," *Thin Solid Films*, vol. 262, 1995, pp. 234–241.

Gutman et la., "Integration of copper multilevel interconnects with oxide and polymer interlevel dielectrics," *Thin Solid Films*, vol. 270, No. 1/2, Dec. 1995, pp. 472–479.

Murarka et al., "Copper interconnection schemes: Elimination of the need of diffusion barrier/adhesion promoter by the use of corrosion resistant, low resistivity doped copper," *Microelectronics Technology and Process Integration*, Austin TX, USA, Oct. 20–21, 1994, Proceedings of the SPIE— The International Society for Optical Engineering, vol. 2335, 1994, pp. 80–90.

* cited by examiner

Primary Examiner—John F. Niebling
Assistant Examiner—Lynne A. Gurley
(74) Attorney, Agent, or Firm—Charles S. Guenzer

(57) ABSTRACT

A copper metallization structure and its method of formation in which a layer of a copper alloy, such as Cu—Mg or Cu—Al is deposited over a silicon oxide based dielectric layer and a substantially pure copper layer is deposited over the copper alloy layer. The copper alloy layer serves as a seed or wetting layer for subsequent filling of via holes and trenches with substantially pure copper. Preferably, the copper alloy is deposited cold in a sputter process, but, during the deposition of the pure copper layer or afterwards in a separate annealing step, the temperature is raised sufficiently high to cause the alloying element of the copper alloy to migrate to the dielectric layer and form a barrier there against diffusion of copper into and through the dielectric layer. This barrier also promotes adhesion of the alloy layer to the dielectric layer, thereby forming a superior wetting and seed layer for subsequent copper full-fill techniques. Filling of the alloy-lined feature can be accomplished using PVD, CVD, or electro/electroless plating.

38 Claims, 2 Drawing Sheets

COPPER ALLOY SEED LAYER FOR COPPER METALLIZATION

RELATED APPLICATION

This application is a continuation in part of Ser. No. 08/853,191, filed May 8, 1997 now U.S. Pat. No. 6,037,257 in the names of Ding, Chiang, Chin, Hashim and Sun, entitled Sputter Deposition and Annealing of Copper Alloy Metallization.

FIELD OF THE INVENTION

The invention relates generally to metal depositions in semiconductor integrated circuits. In particular, the invention relates to copper metallizations.

BACKGROUND ART

A critical part of any advanced semiconductor integrated circuit involves the one or more metallization levels used to contact and interconnect the active semiconductor areas, themselves usually residing in a fairly well defined crystalline silicon substrate. Although it is possible to interconnect a few transistors or other semiconductor devices, such as memory capacitors, within the semiconductor level, the increasingly complex topology of multiply connected devices soon necessitates another level of interconnect. Typically, an active silicon layer with transistors and capacitors formed therein is overlaid with a dielectric layer, for example, silicon dioxide. Contact holes are etched through the dielectric layer to particular contacting areas of the silicon devices. A metal is filled into the contact holes and is also deposited on top of the dielectric layer to form horizontal interconnects between the silicon contacts and other electrical points. Such a process is referred to as metallization.

A single level of metallization may suffice for simple integrated circuits of small capacity. However, dense memory chips and especially complex logic devices require additional levels of metallization since a single level does not provide the required level of interconnection between active areas. Additional metallization levels are achieved by depositing over the previous metallized horizontal interconnects another level of dielectric and repeating the process of etching holes, now called vias, through the dielectric, filling the vias and overlaying the added dielectric layer with a metal, and defining the metal above the added dielectric as an additional wiring layer. Very advanced logic device, for example, fifth-generation microprocessors, have five or more levels of metallization.

Conventionally, the metallized layers have been composed of aluminum or aluminum-based alloys additionally comprising at most a few percent of alloying elements such as copper and silicon. The metallization deposition has typically been accomplished by physical vapor deposition (PVD), also known as sputtering. A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 composed of the material to be sputter deposited on a wafer 16 held on a heater pedestal 18. A shield 20 held within the chamber protects the chamber wall 12 from the sputtered material and provides the anode grounding plane. A selectable DC power supply 22 biases the target negatively to about −600VDC with respect to the shield 20. Conventionally, the pedestal 18 and hence the wafer 16 is left electrically floating.

A gas source 24 of sputtering working gas, typically chemically inactive argon, supplies the working gas to the chamber through a mass flow controller 26. A vacuum system 28 maintains the chamber at a low pressure. Although the chamber can be pumped to a base pressure of about $10^{-7}$ Torr or even lower, the pressure of the working gas is typically kept between about 1 and 1000 mTorr. A computer-based controller 30 controls the reactor including the DC power supply 22 and the mass flow controller 26.

When the argon is admitted into the chamber, the DC voltage ignites the argon into a plasma, and the positively charged argon ions are attracted to the negatively charged target 14. The ions strike the target 14 at a substantial energy and cause target atoms or atomic clusters to be sputtered from the target 14. Some of the target particles strike the wafer 16 and are thereby deposited on it, thereby forming a film of the target material.

To provide efficient sputtering, a magnetron 32 is positioned in back of the target 14. It has opposed magnets 34, 36 creating a magnetic field within the chamber in the neighborhood of the magnets 34, 36. The magnetic field traps electrons, and for charge neutrality, the ion density also increases to form a high-density plasma region 38 within the chamber adjacent to the magnetron 32. However, it is understood that a plasma of decreasing density extends towards the wafer 16.

With the continuing miniaturization of integrated circuits, the demands upon the metallization have increased. Many now believe that aluminum metallization should be replaced by copper metallization. Murarka et al. provide a comprehensive review article on copper metallization in "Copper metallization for ULSI and beyond," *Critical Reviews in Solid State and Materials Science*, vol. 10, no. 2, 1995, pp. 87–124. Copper offers a number of advantages. Its bulk resistivity is less than that of aluminum, 1.67 $\mu\Omega$-cm vs. 2.7 $\mu\Omega$-cm for pure material, and any reduction in resistivity offers significant advantages as the widths and thicknesses of the metallization interconnects continue to decrease. Furthermore, a continuing problem with aluminum metallization is the tendency of aluminum atoms in an aluminum interconnect carrying a high current density to migrate along the interconnect, especially away from hot spots, in a process called electromigration. Any excessive amount of such migration will break an aluminum interconnect and rendering inoperable the integrated circuit. Copper-based alloys exhibit significantly reduced levels of electromigration.

Copper metallization is an unproven technology and is acknowledged to offer difficulties not experienced with the conventional aluminum metallization. However, it may afford ways to circumvent problems inherent in aluminum metallization.

Murarka et al. in the aforecited review article recommend alloying copper with magnesium or aluminum to improve the interfacial qualities. Later work done by the Murarka group at Rensselaer Polytechnic Institute and their collaborators have developed a useful technique for forming dependable copper interconnects and provide a model for its operation. As Lanford et al. describe in "Low-temperature passivation of copper by doping with Al or Mg," *Thin Solid Films*, vol. 262, 1995, pp. 234–241, sputtering is used, as illustrated in the schematic cross section of FIG. 2, to deposit a film of copper alloy on a substrate. The primary examples of the alloying element are aluminum and magnesium. The copper alloy film can be deposited as alternating layers of copper and the alloying element, or the two constituents can be co-sputtered, for example, by use of a copper alloy sputtering target. After completion of the sputtering at near to room temperature, the wafer is annealed, for example, at 400° C. in argon for 30 minutes. The annealing causes a large fraction of the magnesium to diffuse to the outside of a remaining copper film and to react with any oxygen present at the interfaces to form a film of magnesium oxide. The MgO film encapsulates the Mg-alloyed Cu body. The upper free surface of the copper film is passivated by the MgO film. Magnesium oxide is a stable oxide and stops growing at a thickness in the range of 5 to 7 nm. The thin oxide is not believed to cause a high contact resistance, but in any case the oxide can be removed by a sputter etch prior to the deposition of a subsequent metallization. Lanford et al., ibid., suggest that the free surface is oxidized to MgO by oxygen impurities in the argon.

Metallization in advanced integrated circuits faces a demanding requirement in filling high-aspect ratio holes. Increasing device density requires that the feature sizes be further reduced. However, dielectric breakdown has prevented the thickness of interlevel dielectric levels from being similarly reduced. As a result, the aspect ratio of vias and contacts has been increasing. The aspect ratio is the ratio of the depth of the hole through the dielectric forming the via or contact and the minimum lateral size of that hole. An aspect ratio of 5:1 is considered developmental technology, but even higher values will be required. Assuming that high aspect-ratio holes can be etched, the problem remains of filling them with metal for the interlevel connection. The geometry of high aspect-ratio holes is unfavorable for sputtering since conventional sputtering is fairly isotropic so that little sputtered material strikes the bottom of the hole compared to the lip of the hole, and the sputtering is likely to bridge the top of the hole and prevent any further deposition. The hole filling problem is illustrated in cross section in FIG. 2. A narrow and deep hole 40 is etched into a silicon oxide substrate 42, which contains unillustrated structure to be electrically contacted. A copper layer 44 is then filled into the hole 40. If the filling is performed by a standard PVD process including an initial cold deposition to form a surface layer followed by a hot final deposition to complete the filling, a void 46 is likely to form in the hole because the copper dewets from the oxide sides of the hole 40. Once the copper bridges over the void 46 midway through the deposition, it is virtually impossible to remove the void and complete the hole filling.

At least two techniques are used to overcome the unfavorable geometry of hole filling, directional sputtering and reflow. In directional sputtering, one or more of various techniques are used to produce a flux of sputtered particles incident upon the wafer which are heavily concentrated in the normal direction. Reflow relies on the fact that metals flow at moderately low temperatures so that the metal, although initially deposited in a undesirable distribution, is made to flow into the hole and to fill it. The reflow may be produced in a post-deposition anneal or may occur on an ongoing basis during a hot deposition.

Directional sputtering may be achieved by many methods, including long-throw, collimation, and electrostatic attraction of ionized sputtered ions in a high-density plasma. Directional sputtering, although not required by the invention, is advantageously used in conjunction with it, as will be discussed later.

Reflow of metallizations, especially copper, presents several difficulties. Unlike aluminum, copper has a relatively high melting point. Heating the substrate to the melting temperature of the metallization would incur too high a thermal budget and may be inconsistent with prior processing steps. Aluminum and copper do flow at somewhat lower temperatures than their melting points, but the interface between either of these metals and the silicon dioxide forming the usual interlevel dielectric is not favorable for reflow. Neither aluminum nor copper wet well with silicon dioxide at certain high temperatures. As a result, these metals do not flow in a smooth layer down a wall of silicon dioxide. Indeed, if aluminum or metal is present as a thin layer on a surface of silicon dioxide, the metal tends to ball up in isolated locations.

Xu et al. have addressed the reflow problem with aluminum metallization in U.S. patent application, Ser. No. 08/628,835, filed Apr. 5, 1996. They recommend using a carrier layer of TiN and possibly Ti deposited by a high-density plasma to perform a number of functions including increasing the adhesion of aluminum deposited in a narrow aperture extending through silicon dioxide. The carrier layer acts as a glue layer that adheres well to silicon dioxide and also acts as a wetting layer for the later deposited aluminum. As a result, the aluminum flows down the carrier layer at a relatively low temperature and thus easily fills the hole.

SUMMARY OF THE INVENTION

A structure and fabrication method for copper metallization including a copper alloy film deposited, preferably by cold sputtering, on a dielectric layer of silicon oxide. A purer copper film is then deposited on the copper alloy layer, and after the start of copper deposition the temperature is raised to promote the diffusion of the alloying element within the copper alloy layer.

The invention is applicable, among other uses, to copper filling of narrow apertures, such as vias and trenches. The invention is also applicable to planarization of copper.

DETAILED DESCRIPTION OF THE PREFERRED EMBODIMENTS

The parent patent application, incorporated herein by reference in its entirety, discloses the advantages of a self-annealed copper metallization including an alloying element such as magnesium or aluminum. When deposited under the proper conditions, the alloying element readily diffuses to both the interface at the exposed top surface to form a self-passivating metal oxide layer with the alloying element and to form a barrier of an oxide of the alloying metal and silicon at the underlying silica interface.

The disclosure in the parent application is primarily directed to the formation and advantages of the barrier between the copper and the silica. We have discovered that similar processes with possibly some variations can be advantageously used for hole filling.

Figure 1:
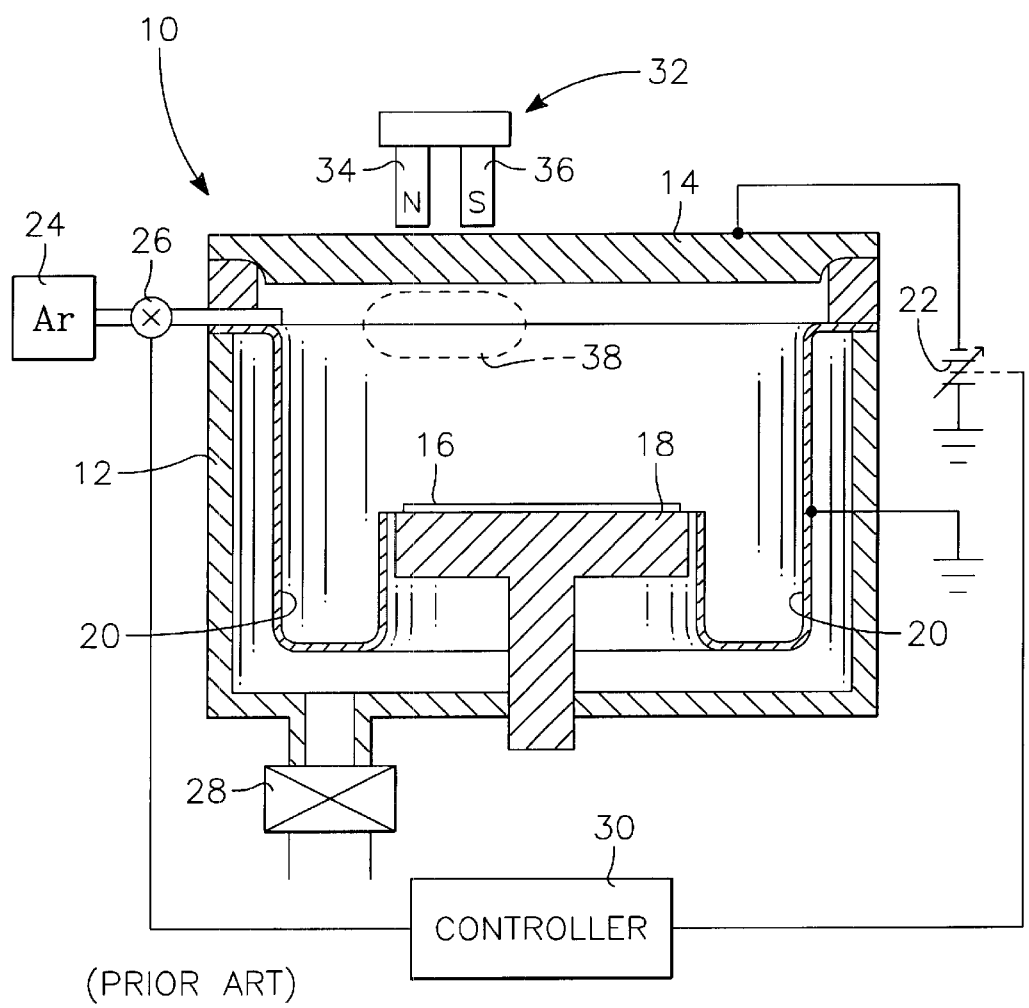
FIG. 1 is schematic cross-sectional view of a PVD reactor useful in practicing the invention.
Figure 2:
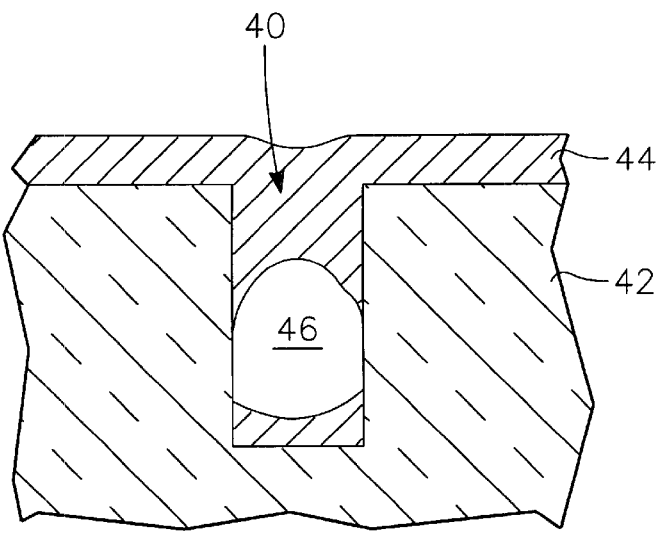
FIG. 2 is a schematic cross-sectional view of a void formed in filling a hole in a dielectric.
Figure 3:
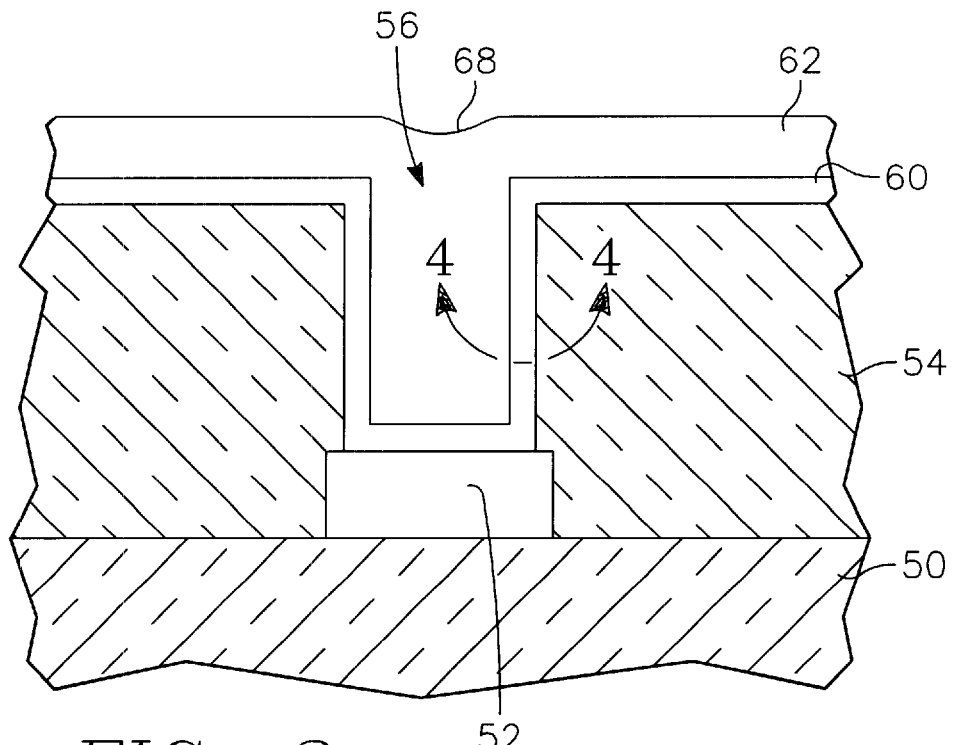
FIG. 3 is a cross-sectional view of a via filled with copper according to one embodiment of the invention.

According to one embodiment of the invention, as illustrated in the cross-sectional view of FIG. 3, a substrate includes a first dielectric layer 50 having a metal line 52 on its surface. The discussion will primarily be directed to interlevel vias, that is, conductive holes from one level of metallization to another, rather than to contacts to underlying silicon areas. A second dielectric layer 54 is deposited over the metal line 52 and the first dielectric layer 50. The second dielectric layers 54 in this embodiment is composed of a silicon oxide, for example, silicon dioxide deposited by a plasma-enhanced CVD process, although other forms of silica and silicate glasses can also be used to much the same effect. The metal line 52 is preferably formed of copper although the copper technology of the invention can be combined with lower aluminum metallization, for example, of Al/Ti/TiN. A via hole 56 is photolithographically etched through the second dielectric layer 54 down to the underlying metal line 52.

A seed layer 60 of a copper alloy is then sputter deposited into the via hole 56 and atop the second dielectric layer 54 under conditions favoring good bottom and sidewall coverage of the narrow via hole 56. Fu et al. disclose in U.S. patent application, Ser. No. 08/854,008, filed May 8, 1997 entitled Sustained Self-Sputtering Reactor Having an Increased Density Plasma a reactor for sustained self-sputtering of copper, which can be advantageously used for the required nearly conformal sputter deposition of copper and its alloys.

The seed layer 60 needs to be deposited only to a very small thickness of about 5 to 10 nm. It may be thicker, up to about 200 nm, but additional thickness detracts from production efficiency in the hole filling process to be described later. Thus, a thickness of no more than 50 or 100 nm is preferred in a production environment. If the seed layer 60 is being used to fill a narrow hole, the stated thickness is that on the side and bottom of the hole. The thickness of a sidewall deposition may be only a fraction of the thickness of deposition on a planar top surface with the ratio depending upon the feature size, its aspect ratio, and the sputtering conditions. The seed layer 60 can be sputter deposited under hot conditions so that the layer 60 self-anneals during deposition. A hot sputter is performed preferably with the substrate held in the range of 200 to 400° C. although higher temperatures are possible. However, the complexity of hot sputtering is not required for many of the effects of the invention. Instead, the seed layer 60 can be sputter deposited under cold conditions below 200° C. or even below 100° C., temperatures not favoring the diffusion of the alloying element to the interfaces. It is possible under cold sputter deposition that a copper oxide layer forms at the exposed surface of the seed layer 60, but the preferred filling process removes the copper oxide.

We have observed that the copper alloy seed layer 60 forms with a very smooth surface. In particular, a 200 nm thick Cu—Mg layer deposited on $SiO_2$ and thereafter annealed at 450° C. for 30 minutes produced a very smooth surface. A 20 nm layer of pure copper similarly deposited over a 20 nm tantalum barrier over $SiO_2$ produced gross agglomeration of the copper, indicating severe dewetting at temperatures as low as 200° C. These results indicated that a smooth copper alloy seed layer 60 provides good wetting to after deposited copper and thus promotes copper full-fill of deep vias and trenches.

After the thin seed layer 60 has been deposited, the via hole 56 is filled by a second deposition step with relatively pure copper. By relatively pure copper is meant copper that is at least 99 atomic % pure, and the 1% impurity or doping level does not apply to the alloying elements discussed here. The full-fill deposition step producing the copper layer 62 may be performed by PVD, by chemical vapor deposition (CVD), or by electroplating or electroless plating. These deposition methods are described by Murarka et al. in the previously cited article in *Critical Reviews*. Preferably, the alloy seed layer 60 is deposited in a cold sputter, and the pure copper deposition is performed before the seed layer is annealed. As a result, it is likely that the copper alloy seed layer 60 spontaneously oxidizes to form a surface layer of copper oxide although the oxygen can be annealed out because of the Cu—O bond is not very strong. For a PVD copper full-fill, it should be performed at a relatively high temperature above 300° C., preferably 400 to 550° C. The second PVD deposition may be a standard PVD process, collimated PVD, high-density plasma PVD, or yet other variations. For CVD deposition, a plasma preclean may be used. Electroplating will naturally remove the copper oxide. The smooth surface of the copper alloy seed layer 60 promotes reflow into via holes at relatively low temperatures without dewetting due to the good adhesion of Cu—Mg to the oxide. A smooth Cu alloy surface promotes adhesion for the later deposited copper. For CVD copper, reflow temperatures of no more than 200° C. are needed; for electroplated copper, no more than 100° C.

Figure 4:
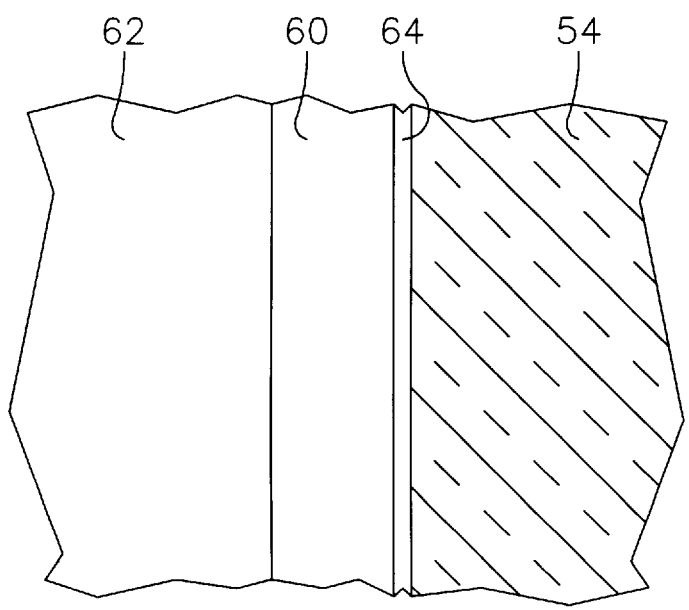
FIG. 4 is an enlarged cross-sectional view of a portion indicated by circle 4—4 of FIG. 3 after the formation of the barrier.

After the via filling, the structure is annealed to cause the alloying element to diffuse within the copper alloy seed layer 60. The alloying element diffuses towards the dielectric layer 54 and forms a very thin barrier layer 64, as illustrated in the enlarged cross-sectional view in FIG. 4, at the interface between the seed layer 60 and the dielectric layer 54 that prevents copper from diffusing into and through the silica dielectric layer 54. The barrier layer 64 comprises an oxide of the alloying element along with some of the silicon. The alloying element will also diffuse into the copper fill 62, but the thickness of the planar overlayer of copper needs to be minimized if the thin seed layer 60 is to provide enough alloying element to form a surface passivating layer. Typically, however, the free-surface passivation is not important because the entire surface will be polished flat in a subsequent step of chemical mechanical polishing. The annealing is preferably performed within the temperature range of 300 to 400° C. although temperatures up to 600° C. can be used if they do not thermally degrade other structures on the wafer.

The annealing can be performed in a separate annealing furnace or by rapid thermal processing involving radiant lamps. It also can be performed by in situ PVD annealing, that is, either a PVD deposition performed at an elevated substrate temperature or an anneal performed in the PVD chamber after cessation of the PVD deposition. The annealing ambient may be either high vacuum, a forming gas to minimize oxidation, or a reduced oxygen partial pressure to form a surface layer of the oxide of the alloying element, e.g., MgO or $Al_2O_3$, but not copper oxide.

The single copper alloy seed layer 60 thus provides both a barrier layer at the silica interface and an adhesion/wetting layer at the copper interface. In the prior art, separate barrier and wetting layers had been required for filling deep holes in silica with copper.

Although the description above referred to hole via for a generally square or circular via hole, the invention may be applied to other geometries. The aperture may be a trench extending a substantial distance along the surface of the dielectric. The trench need not extend through the dielectric, and the pure copper may be applied as a relatively thin conformal layer over the alloy layer in the trench.

Another application of the alloy seed layer of the invention is for copper planarization. As shown in FIG. 3, a small dimple 68 forms at the surface of the copper layer 62 overlying the via hole 56. In view of the fact the via hole 56 may be much deeper than the thickness of the planar portion of the copper layer 62, the geometry of hole filling would indicate a much deeper dimple 68, which could severely impact later formed layers. However, the same effects produced by the seed layer 60 of the invention which promote full filling of deep holes also promote the planarization of the upper surface of the copper layer 62 due to lateral reflow of the copper as it is being deposited or is afterwards annealed, thereby reducing the size of the dimple 68.

Although magnesium is the most preferred alloying element for copper and aluminum is also known to provide beneficial results, yet other alloying elements have been used with copper, for example, boron, tantalum, tellurium, and titanium. To provide the benefits described above, such an alloying element should form stable oxides and readily diffuse through copper. Generally, the atomic alloying percentages range up to 10 atomic %. However, it is now generally believed that the Mg alloying should be kept below 6 atomic % and the Al alloying should be kept below 0.3 atomic %. A minimum alloying percentage is 0.05 atomic %.

The invention thus provides a copper metallization structure that exhibits many beneficial characteristics without undue complexity in the structure or its fabrication. The copper alloy not only provides a barrier at the dielectric interface and passivation at the free interface but also promotes the deposition of a later deposited copper layer. The effect is particularly effective in filling holes of high aspect ratios.

What is claimed is:

1. A method of forming a copper metallization, comprising the steps of:
    a first step of sputter depositing onto a dielectric part of a substrate comprising silicon and oxygen a copper alloy layer comprising copper and less than 10 atomic percent of an alloying element; and
    a second step of depositing onto said copper alloy layer a copper layer.

2. The method of claim 1, wherein said copper layer consists of substantially pure copper.

3. The method of claim 1, wherein said first step is performed while maintaining said substrate at a temperature equal to or above 200° C.

4. The method of claim 3, wherein said temperature is no more than 400° C.

5. The method of claim 1, wherein said second step comprises plating copper.

6. The method of claim 1, wherein said second step comprises chemical vapor deposition of copper.

7. The method of claim 1, wherein said second step comprises physical vapor deposition of copper.

8. The method of claim 7, wherein said first step is performed while holding said substrate at a first temperature that is substantially lower than a second temperature in said second step sufficiently high to cause said alloying element to diffuse in said copper alloy layer.

9. The method of claim 8, wherein said first temperature is less than 200° C.

10. The method of claim 9, wherein said first temperature is less than 100° C.

11. The method of claim 1, further comprising annealing said structure after said second step to cause said alloying element to diffuse in said copper alloy layer.

12. The method of claim 1, wherein said first step is performed while holding said substrate at a temperature below 200° C.

13. The method of claim 1, wherein said dielectric part of said substrate includes an aperture therein, wherein said first step deposits said copper alloy layer on sides of said aperture, and wherein said second step deposits said copper in said aperture onto said copper alloy layer.

14. The method of claim 1, wherein said copper alloy layer directly contacts said dielectric part.

15. The method of claim 1, wherein said alloying element is selected from the group consisting of magnesium, aluminum, boron, tantalum, tellurium, and titanium.

16. The method of claim 15, wherein said alloying element is selected from the group consisting of magnesium and aluminum.

17. The method of claim 16, wherein said alloying element comprises magnesium.

18. The method of claim 16, wherein said alloying element comprises aluminum.

19. A method of forming a metallization layer in an aperture formed in a dielectric part of a substrate comprising silicon and oxygen, said method comprising sputter depositing onto sides and a bottom of said aperture a copper alloy layer comprising copper and less than 10 atomic percent of an alloying element.

20. The method of claim 19, wherein said alloying element comprises magnesium.

21. The method of claim 20, wherein said magnesium is present in said copper alloy layer in an amount of between 0.05 and 6 atomic percent.

22. The method of claim 19, wherein said alloying element comprises aluminum.

23. The method of claim 22, wherein said aluminum is present in said copper alloy layer in an amount of between 0.05 and 0.3 atomic percent.

24. The method of claim 19, wherein said alloying element is selected from the group consisting of boron, tantalum, tellurium, and titanium.

25. The method of claim 19, wherein said copper alloy layer has a thickness of no more than 100 nm.

26. The method of claim 25, wherein said copper alloy layer is sputter deposited directly onto said dielectric part.

27. The method of claim 25, wherein said thickness is no more than 50 nm.

28. The method of claim 27, wherein said thickness is no more than 10 nm.

29. The method of claim 19, further comprising a subsequent step of filling copper into a portion of said hole not occupied by said copper alloy layer.

30. The method of claim 29, wherein said filling step fills 99 atomic percent pure copper into said portion.

31. The method of claim 29, wherein said sputtering and filling steps are performed at different temperatures.

32. The method of claim 29, wherein said filling step comprises electroplating.

33. The method of claim 32, wherein said alloying element comprises magnesium present in said copper alloy layer in an amount of between 0.05 and 6 atomic percent.

34. The method of claim 32, wherein said alloying element comprises aluminum present in said copper alloy layer in an amount of between 0.05 and 0.3 atomic percent.

35. The method of claim 19, wherein said copper alloy layer directly contacts said dielectric part.

36. The method of claim 19, wherein a free space is formed between said copper alloy layer deposited on said sides of said aperture.

37. The method of claim 19, including maintaining said copper alloy layer at a temperature causing said alloying element to diffuse to a side of said aperture adjacent said dielectric part.

38. A method of forming a copper vertical interconnect in a hole extending through a silicon oxide layer, comprising the steps of:

a first step of sputtering depositing onto sides of said hole a copper alloy layer having a thickness of no more than 100 nm and comprising copper and less than 10 atomic percent of an alloying element selected from the group consisting of aluminum, magnesium, boron, tantalum, tellurium, and titanium; and a subsequent second step of depositing onto said copper alloy layer a layer of substantially pure copper.

* * * * *